United States Patent
Yang et al.

(10) Patent No.: US 12,160,204 B2
(45) Date of Patent: Dec. 3, 2024

(54) HIGH-SPEED, LOW DISTORTION RECEIVER CIRCUIT

(71) Applicant: MACRONIX INTERNATIONAL CO., LTD., Hsinchu (TW)

(72) Inventors: Shang-Chi Yang, Changhua (TW); Jhen-Sheng Chih, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 740 days.

(21) Appl. No.: 17/384,285

(22) Filed: Jul. 23, 2021

(65) Prior Publication Data

US 2022/0247362 A1    Aug. 4, 2022

Related U.S. Application Data (60) Provisional application No. 63/144,969, filed on Feb. 2, 2021.

(51) Int. Cl.
*H03F 1/32*    (2006.01)
*H03F 3/45*    (2006.01)
*H03K 19/20*   (2006.01)

(52) U.S. Cl.
CPC ....... *H03F 1/3211* (2013.01); *H03F 3/45475* (2013.01); *H03K 19/20* (2013.01)

(58) Field of Classification Search
CPC ............... H03F 1/3211; H03F 3/45475; H03F 2200/24; H03F 2200/279;
(Continued)

(56) References Cited

U.S. PATENT DOCUMENTS 6,452,429 B1    9/2002   Lim
8,274,331 B2 *  9/2012   Chuang ............... H03F 3/45695
                                              330/261
(Continued)

FOREIGN PATENT DOCUMENTS

CN    109358689 A    2/2019
JP    H08130445 A    5/1996
(Continued)

OTHER PUBLICATIONS

Single-Ended Transceiver Design Techniques for 5.33Gb/s Graphics Applications (Year: 2009).*
(Continued)

*Primary Examiner* — Andrea Lindgren Baltzell
*Assistant Examiner* — Jose E Pinero
(74) *Attorney, Agent, or Firm* — Andrew L. Dunlap; Haynes Beffel & Wolfeld LLP (57) ABSTRACT

A receiver circuit has a first stage circuit having a first stage input and a first stage output, the first stage output setting a first stage common mode voltage; a second stage circuit having a second stage input connected to the first stage output, and a second stage output setting a second stage common mode voltage; and a buffer circuit having a trip point voltage, connected to the second stage output. The first stage circuit can include circuit elements configured to establish the first stage common mode voltage so that the second stage common mode voltage matches the trip point voltage. The second stage circuit can include a self-biased amplifier.

20 Claims, 10 Drawing Sheets

(58) Field of Classification Search
CPC . H03F 2203/45026; H03F 2203/45294; H03F 2203/45664; H03F 3/195; H03F 3/45188; H03F 3/45744; H03F 1/301; H03F 1/0211; H03F 3/45183; H03K 19/20; H03K 19/018528; G11C 11/4096; G11C 7/1078; H04B 1/12; H04B 1/16
USPC .......................................................... 330/252
See application file for complete search history.

(56) References Cited

U.S. PATENT DOCUMENTS

| | | |
|---|---|---|
| 9,077,289 B2 | 7/2015 | Huang et al. |
| 10,163,465 B1 | 12/2018 | Ko et al. |
| 2004/0017248 A1 | 1/2004 | Ishida et al. |
| 2004/0174215 A1 | 9/2004 | Li et al. |
| 2005/0212599 A1 | 9/2005 | Lin et al. |
| 2010/0244964 A1 | 9/2010 | Deguchi et al. |
| 2011/0121860 A1 | 5/2011 | Song et al. |
| 2012/0269296 A1 | 10/2012 | Chuang |
| 2013/0315005 A1 | 11/2013 | Yang |
| 2015/0061756 A1 | 3/2015 | Sewani et al. |
| 2020/0186086 A1 | 6/2020 | Chen et al. |

FOREIGN PATENT DOCUMENTS

| | | |
|---|---|---|
| JP | 2003218644 A | 7/2003 |
| JP | 2004062424 A | 2/2004 |
| JP | 2010239481 A | 10/2010 |
| JP | 2011114858 A | 6/2011 |
| JP | 2016534647 A | 11/2016 |
| TW | 201728137 A | 8/2017 |

OTHER PUBLICATIONS

Chappell, et al., "Fast CMOS ECL receivers with 100-mV worst-case sensitivity," IEEE J. of Solid-State Circuits, vol. 23, No. 1, Feb. 1, 1988, 9 pages.
EP Search Report from EP21199697.0 dated Mar. 7, 2022, 5 pages.
Partovi, et al., "Single-ended transceiver design techniques for 5.33Gb/s graphics applications," Solid-State Circuits Conference Digest of Technical Papers, IEEE ISSCC, Feb. 8, 2009, 3 pages.
TW Search Report from TW11120840470 dated Aug. 25, 2022, 8 pages.

\* cited by examiner

HIGH-SPEED, LOW DISTORTION RECEIVER CIRCUIT

PRIORITY

This application claims the benefit of U.S. Provisional Patent Application No. 63/144,969 filed 2 Feb. 2021, which application is incorporated herein by reference.

BACKGROUND

Field

The present invention relates to high-speed, low distortion receivers utilized in integrated circuits, such as used in input buffers for receiving data from external sources.

Description of Related Art

Integrated circuits are often configured to receive high-speed data signals, such as double-data-rate DDR signals exceeding gigabits per second. For example, a high-speed receiver can be connected to an input/output pin on an integrated circuit, which is coupled to a transmission line for communication of data among chips.

Figure 1:
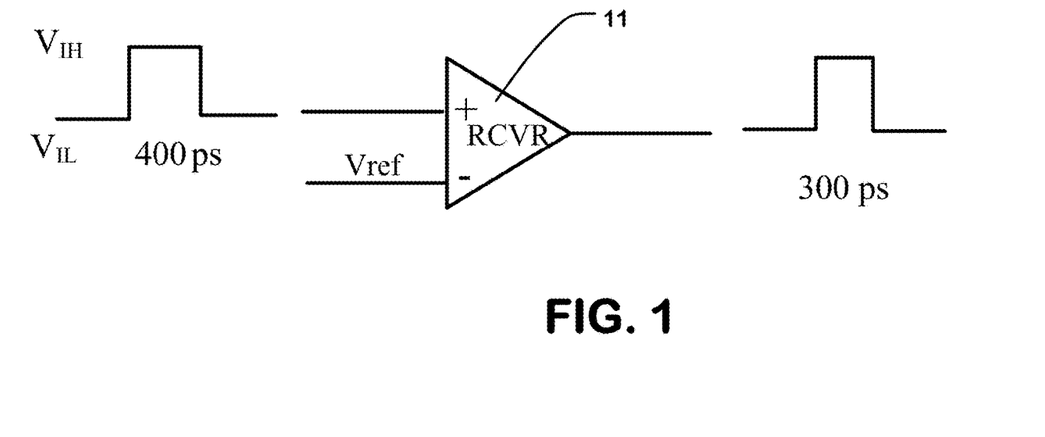
FIG. 1 is a heuristic diagram illustrating distortion in a conventional receiver.

As the data rates become higher, the pulse width of the input signals becomes smaller. The pulse width is a very important characteristic of some data signals, such as DDR signals where both the rising and falling edges are sensed. FIG. 1 illustrates a basic receiver circuit. In the example of FIG. 1, a receiver 11 is configured basically as a comparator. The receiver 11 receives an input pulse having for example a pulse width of 400 picoseconds (ps), and compares the input pulse to a reference voltage Vref. Ideally, the output of the receiver 11 would also have a pulse width of 400 picoseconds (ps). However, due to distortion in the receiver, the pulse width of the output signal may be different, such as, in this example, 300 ps. Also, pulse magnitudes, as represented by the low input voltage $V_{IL}$ and the high input voltage $V_{IH}$, become smaller as data rates increase, making operation of the receivers more complex.

It is desirable to provide a receiver circuit suitable for use in integrated circuits, with operable at high speeds, with low distortion.

SUMMARY

A receiver circuit is described including a first stage circuit having a first stage input and a first stage output, the first stage output setting a first stage common mode voltage; a second stage circuit having a second stage input connected to the first stage output, and a second stage output setting a second stage common mode voltage; and a buffer circuit having a trip point voltage, connected to the second stage output. The first stage circuit can include circuit elements configured to establish the first stage common mode voltage so that the second stage common mode voltage matches the trip point voltage.

The circuit can receive a single-ended signal at the first stage input, and provide the first stage output as a differential pair of signals.

The first stage circuit can be disposed in a first power domain, and the second stage circuit can be disposed in a second power domain, different from the first power domain.

The second stage circuit can comprise a self-biased amplifier.

A receiver circuit is described including a first differential pair of transistors, a reference current circuit, a second differential pair of transistors and a buffer circuit. The first differential pair of transistors, in this example, have drains connected through first and second matching resistors to a first drain-side supply voltage, and sources connected to a current source transistor. A first transistor in the first differential pair has a gate connected to a reference voltage, and a second transistor in the first differential pair has a gate connected to a first stage input. The drains of the first differential pair of transistors provide a differential pair of signals as a first stage output.

The reference current circuit in this example comprises a reference resistor, a first transistor and a second transistor in series between the drain-side supply voltage and a source-side supply voltage. The first transistor has a gate connected to the reference voltage; and the second transistor has a gate connected to a node between the reference resistor and the first transistor of the reference current circuit, and connected to a gate of the current source transistor connected to the first differential pair of transistors.

The second differential pair of transistors, in this example, has drains connected through first and second current mirror transistors to a second drain-side supply voltage, gates connected to respective ones of the differential pair of signals, and sources connected to a second current source transistor.

The buffer circuit in this example is connected to the drain of the first one of the second differential pair of transistors.

The second current source transistor can have a gate connected to the drain of a second one of the second differential pair of transistors.

A voltage regulator can be used to generate the second drain-side supply voltage.

A data receiver is described including a first amplifier circuit (first stage) configured to receive a reference voltage and a first stage input signal, and to output control voltages based on the reference voltage and the first stage input signal. In this example, a self-biased amplifier circuit is configured to receive the control voltages from the first amplifier circuit and to provide a self-bias voltage and an output signal, wherein the self-bias voltage is connected to a current mirror of the self-bias amplifier circuit.

Other aspects and advantages of the present invention can be seen on review of the drawings, the detailed description and the claims, which follow.

DETAILED DESCRIPTION

Figure 2:
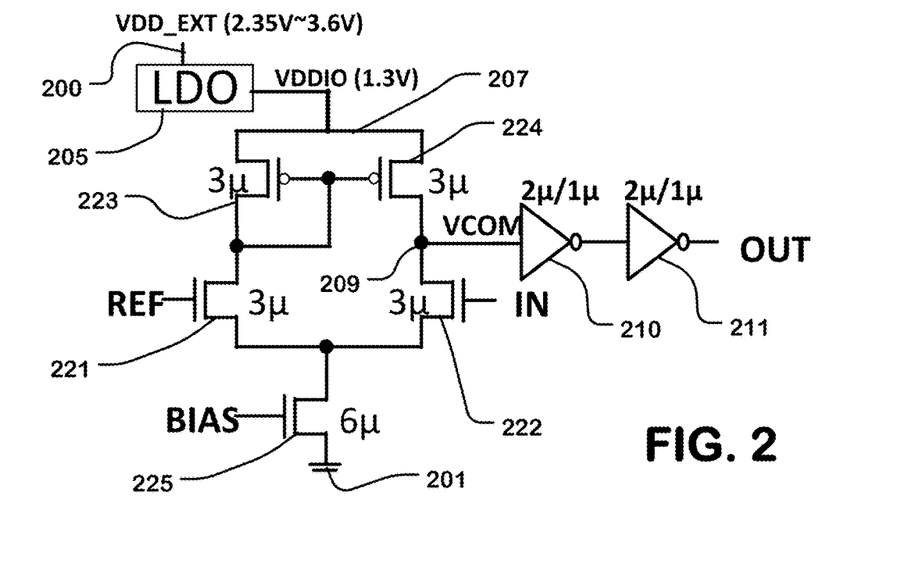
FIG. 2 is a circuit diagram of an example of a conventional receiver circuit.

FIG. 2 is a circuit diagram for an example receiver circuit which comprises a one-stage operational amplifier. The circuit is deployed in a power domain including having a drain-side reference voltage VDDIO at about 1.3 V at node 207 provided by a low dropout LDO voltage regulator 205, and a source-side reference voltage provided by a VSS node 201. The power for the LDO voltage regulator 205 is provided by an external drain-side voltage reference VDD_EXT which may vary between about 2.35 V and about 3.6 V in this example.

A power domain includes circuits configured to be powered by a voltage source having a first supply voltage referred to conventionally as VDD or VCC at a drain side reference node (or equivalently collector side) and a second supply voltage referred to conventionally as VSS or VEE at a source side reference node (or equivalently emitter side). Often, the VSS or VEE voltage is a DC ground voltage. For some voltage domains, the source-side reference node can be connected to AC ground or to other voltage references. Some integrated circuits have a plurality of power domains.

The circuit in FIG. 2 includes a first differential pair of n-channel MOS transistors 221, 222, having drains connected through first and second p-channel MOS transistors 223 and 224 configured as a current mirror, to node 207. The first and second p-channel MOS transistors 223 and 224 have their gates connected together, and to the drain of the transistor 221 in the first differential pair.

The gate of transistor 221 is connected to a reference voltage REF. The gate of transistor 222 is connected to the input node IN, at which a high-speed data signal may be received.

The sources of transistors 221, 222 are connected together, and to the drain of a current source transistor 225. Current source transistor 225 is an n-channel MOS transistor in this example, and has a gate connected to a bias voltage BIAS and a source connected to a VSS node 201.

In FIG. 2, representative transistor widths are provided. Generally, in this example, the sizes (e.g. 3μ) of the differential pair of transistors 221 and 222 are the same, and the sizes (e.g. 3μ) of the current mirror transistors to 23 and 224 are the same. The size (e.g. 6μ) of the current source transistor 225 is equal to the sum of the widths of the differential pair of transistors 221, 222.

A signal is produced at the node 209 which has a common mode voltage VCOM The common mode voltage VCOM is a function of the variations in the input data signal and other circuit factors. Generally, when the input data signal at node IN is greater than the reference voltage REF, the signal at node 209 is low, and when the input data signal at node IN is less than the reference voltage REF, the signal at node 209 is high. Node 209 is connected to the input of an inverter 210, the output of which is connected to a second inverter 211, which provides an output signal on node OUT. The inverters 210 and 211 are labeled with representative transistor sizes (2μ/1μ) representing the widths of the p-channel and n-channel MOS transistors used to implement the inverters.

As mentioned above, the output signal on node OUT represents the input signal on node IN. However, the output signal can be distorted.

Figure 3:
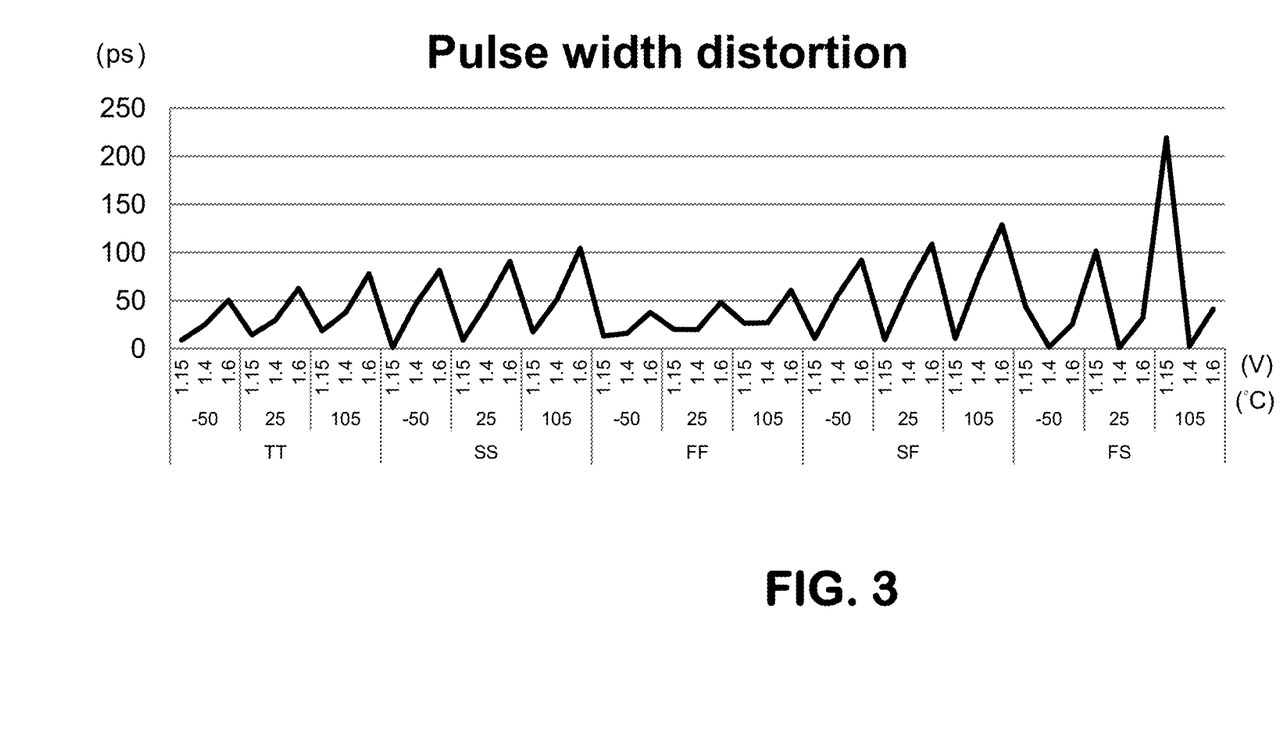
FIG. 3 is a process corner graph illustrating pulse width distortion for a circuit like that of FIG. 2, over process, voltage, and temperature PVT variations.

FIG. 3 is a process corner graph illustrating pulse width distortion for a circuit like that of FIG. 2 over a temperature range from about −50° C. to about 105° C. and a supply voltage range of about 1.15 V to about 1.6 V. As seen, the maximum distortion in this example is about 219 ps, for a first stage input signal having a pulse width of 400 ps.

Figure 4:
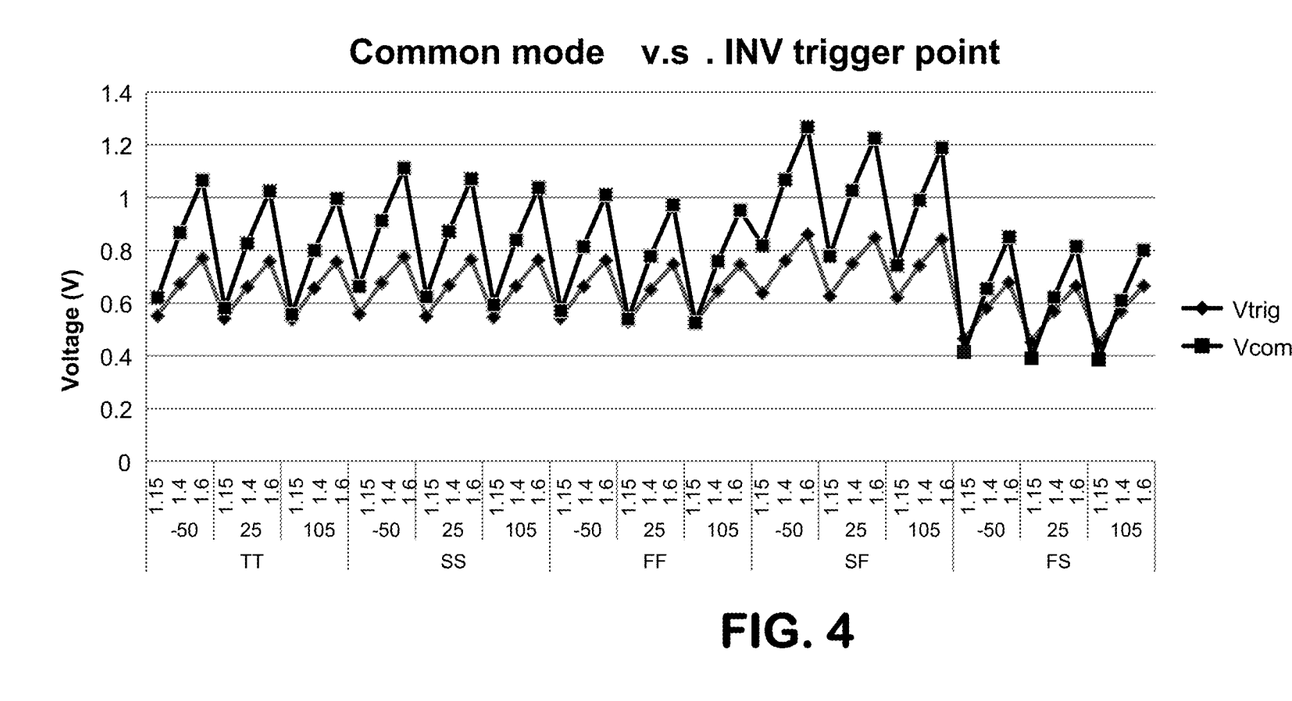
FIG. 4 is a process corner graph comparing common mode voltage of a receiver circuit like that of FIG. 2 and an inverter trigger point over PVT variations.

FIG. 4 is a process corner graph comparing the common mode voltage VCOM versus the trigger point for the inverter 210 in the circuit of FIG. 2 over a temperature range from about −50° C. to about 105° C. and a supply voltage range of about 1.15 V to about 1.6 V. As seen, the difference varies significantly, and is as much as 0.4 V in some process corners.

Figure 5A:
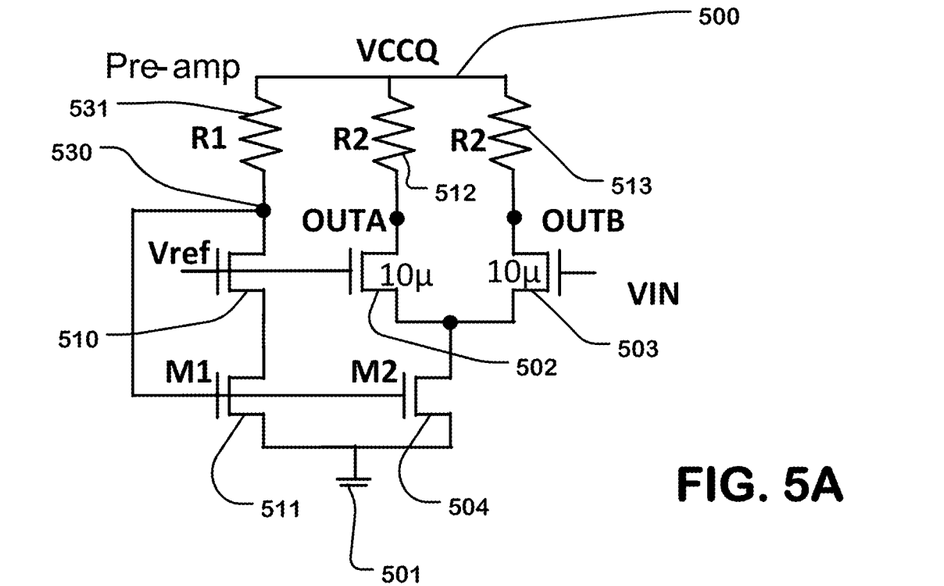
FIGS. 5A and 5B in combination provide a circuit diagram of a two-stage receiver according to the present technology.
Figure 5B:
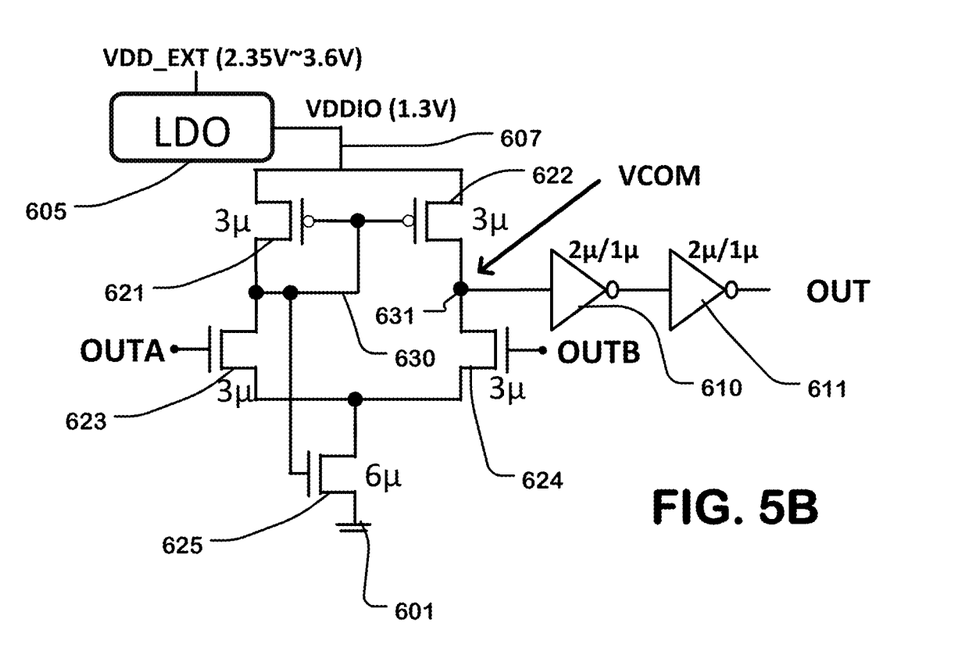

FIGS. 5A and 5B show a two-stage data receiver, for high-speed input signals with low distortion. The first stage is illustrated in FIG. 5A.

The circuit in FIG. 5A is a preamplifier and level shifter, which can shift the voltage level of its output relative to the first stage input signal. The preamplifier includes a differential pair of n-channel MOS transistors 502, 503. Transistor 502 has a drain connected through a resistor 512 having resistance R2 to a drain-side reference voltage VCCQ at node 500. Transistor 503 has a drain connected through a resistor 513 having resistance R2 to the drain-side reference voltage VCCQ at node 500. The sources of transistors 502 and 503 are connected to a drain of n-channel MOS current source transistor 504. A gate of the current source transistor 504 is connected to a bias voltage generated at node 530.

The gate of the transistor 502 is connected to a reference voltage Vref. The gate of transistor 503 is connected to a first stage input node VIN, at which a single-ended input signal is received.

The preamplifier also includes a reference current circuit, including resistor 531 having a resistance R1, n-channel transistor 510, and n-channel transistor 511 connected in series between the drain-side supply node 500, and the source-side supply node 501. Transistor 510 has its gate connected to the reference voltage Vref. Also, transistor 510 can have the same width (e.g. 10 μm) as the transistors 502 and 503. The transistor 511 has its gate connected to node 530, and is arranged in a current mirror fashion with transistor 504. In this example, transistor 511 has a first width and transistor 504 has a second width, which is two times the first width so that is carries twice the current as transistor 511.

The preamplifier provides a first stage output at the nodes OUTA and OUTB. The output in this example is a differential pair of signals, having common mode voltages which are a function of the ratio of the resistances R1 and R2. Because the resistances of the resistors 512 and 513 are the same value R2, and because the transistors 502, 503 have the same sizes, common mode voltages of the signals on nodes OUTA and OUTB are about the same. The value R1 of the resistor 531 controls the voltage at node 530, and therefore controls the magnitude of the current through transistor 511, which by the current mirror configuration controls the current in the current source transistor 504. The common mode voltage of the preamplifier stage at nodes OUTA and OUTB is a function of the current through current source transistor 504. Therefore, the common mode voltage of the preamplifier stage can be adjusted by adjusting the ratio of the resistances R1 and R2. In another embodiment, the common mode voltage can be adjusted by adjusting the relative sizes of the transistors 511 and 504. In another embodiment, the common mode voltage can be adjusted by a combination of adjustments of the sizes of the transistors 511 and 504, and resistances R1 and R2. In other circuits, different circuit elements might be used to adjust the common mode voltage.

The preamplifier circuit of FIG. 5A is deployed in a first voltage domain, in this example, having drain-side supply voltage VCCQ, which may be set based on the voltage-swing of the first stage input signal on the node VIN.

The preamplifier shown in FIG. 5A is one example of an amplifier or level shifter that can shift the DC level relative to the first stage input signal in a manner that can impact the common mode voltage of the second stage, and in some embodiments elevate the DC level of the second stage input signals for the second stage.

FIG. 5B is a circuit diagram for a second stage of the high-speed receiver, in which the outputs on node OUTA and OUTB of the first stage shown in FIG. 5A are connected to the second stage input of the second stage.

The second stage circuit comprises a second differential pair of n-channel MOS transistors 623, 624, having the drains connected through first and second p-channel MOS current mirror transistors 621, 622 to a drain-side supply node 607. The gates of the transistors 623 and 624 are connected to respective ones of the differential pair of signals from the nodes OUTA and OUTB in the first stage circuit of FIG. 5A. The sources of the transistors 623 and 624 are connected in common to the drain of n-channel MOS current source transistor 625, having a source connected to a source-side supply node 601. The current mirror transistors 621 and 622 and their gates are connected together at node 630, and also to the drain of the current mirror transistor 623, in this example. The circuit sets a self-bias voltage at node 630. In addition, the node 630 is connected to the gate of the current source transistor 625.

In this example, the drain-side supply voltage VDDIO at node 607 is about 1.3 V, provided by a voltage regulator 605, such as a low dropout voltage regulator which sets a voltage difference between drain-side node 607 and source-side node 601. Low dropout voltage regulator 605 receives voltage VDD_EXT, in this example, which may range from about 2.35 V to about 3.6 V.

Thus, the second stage circuit in FIG. 5B is deployed in some embodiments in a different voltage domain than the first stage circuit of FIG. 5A.

Node 631 on the drain of transistor 624 is connected as an input to an inverter 610. The output of inverter 610 is applied to the input of inverter 611, which provides an output voltage OUT representing the voltage applied at the node VIN in the amplifier stage of FIG. 5A. Also, node 631 is connected to the drain of the p-channel transistor 622, of the current mirror including transistors 621 and 622, which contributes to the self-biasing of the second stage circuit.

The inverters 610 and 611 provide buffer to avoid an output loading effect on the node 631. The buffer can be implemented using other types of circuits, such as NOR gates, NAND gates, latches and so on.

In the figure, representative transistor widths (e.g. 3 µm) of the differential pair of transistors 623, 624, representative transistor widths (e.g. 3 µm) of the current mirror transistors 621, 622, and a representative transistor width (e.g. 6 µm) of the current source transistor 625 are provided. Also, the inverters 610 and 611 are labeled with representative transistor sizes (2µ/1µ) representing the widths of the p-channel and n-channel MOS transistors used to implement the inverters.

The second stage circuit in FIG. 5B is a self-biased amplifier, by means of connecting the gate of the current source transistor 625 to node 630. As result of the self-biasing, common mode voltage VCOM at node 631 naturally tracks the trigger point of the inverter (or other buffer input) over variations in PVT. By tracking the trigger point of the inverter, distortions related to mismatches of the rising time delay and falling time delay can be reduced. That is, when the trigger point changes, the amount of time it takes for the signal on node 631 to increase in the case of rising edge, or to decrease in the case of a falling edge, to the trigger point also changes. These variations in trigger therefore cause distortion in the form of variation in the pulse width of the output of the inverter.

In this example circuit, the first stage circuit comprises circuit elements which can be used to adjust the common mode voltage VCOM at node 631 in the second stage circuit. The elements in the example of FIG. 5A include the resistors 512 and 513 having value R2, and the resistor 531 having value R1. The values R2 and R1 can be set so that VCOM at node 631 matches the trigger point of the inverter 610. The values R2 and R1 can be determined using simulation, or other techniques known in the electronic design automation technologies for integrated circuit design.

Figure 6A:
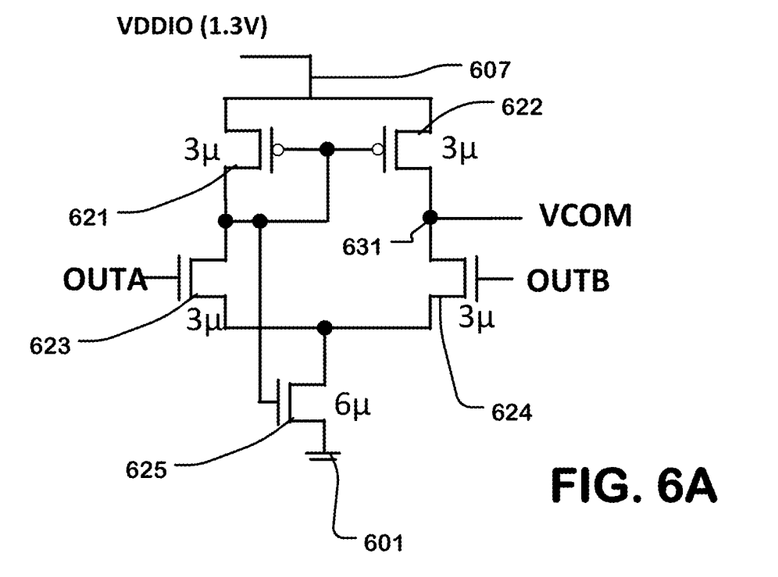
FIGS. 6A through 6C illustrate modeling of a common mode voltage for a self-biasing amplifier like that of the second stage of the circuit of FIGS. 5A and 5B.
Figure 6B:
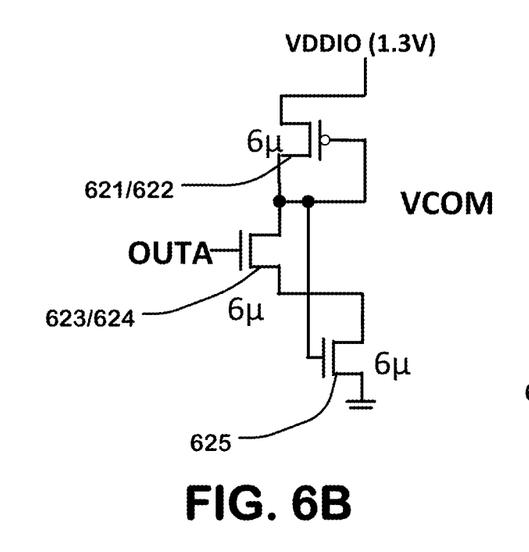
Figure 6C:
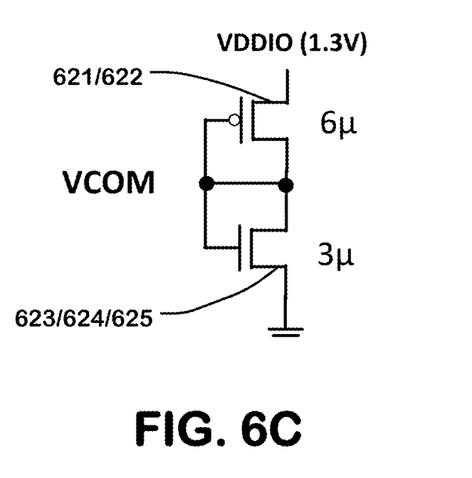

FIGS. 6A-6C are referred to for explanation of how the self-biased amplifier of FIG. 5B can have a common mode voltage which tracks the trigger point of the inverter 610 over variations in PVT. In FIG. 6A, circuit elements of the circuit of FIG. 5B are illustrated with the same reference numerals, with the common mode voltage VCOM labeled for the node 631 at the drain of transistor 624. When the DC level of the signal OUTA is equal to the DC level of the signal OUTB, the circuit can be reduced for the purposes of this explanation to that shown in FIG. 6B, where transistors 623/624 are combined into a single transistor having twice the width, and the transistors 621/622 are combined into a single transistor having twice the width. If the common mode voltage VCOM in the second stage circuit of FIG. 5B is adjusted as discussed above by setting elements of the preamplifier circuit of FIG. 5A, so the common mode at OUTA matches VCOM, the circuit can be reduced for the purposes of this explanation to that shown in FIG. 6C, including a p-channel transistor 621/622 having a width of 6 µm, and an n-channel transistor 623/624/625 having a width of 3 µm. The resulting circuit is an inverter with its input and output connected, and having a ratio of p-channel width to n-channel width equal to 2:1, matching the ratio of the inverter 610, and thereby matching the trigger point of the inverter. In this way, the common mode voltage VCOM in the self-biased amplifier stage of FIG. 5B should track the trigger point of the inverter 610 over variations in PVT.

Figure 7A:
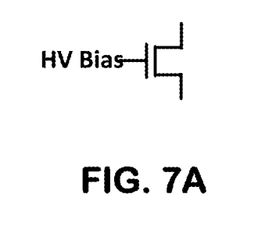
FIGS. 7A through 7D illustrate alternative resistor technologies usable in receivers as described herein.
Figure 7B:
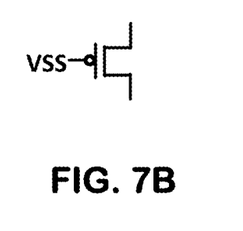
Figure 7C:
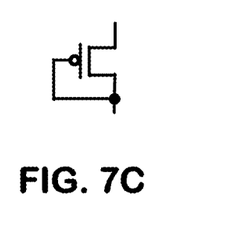
Figure 7D:
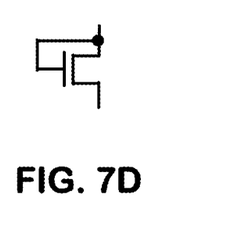

The resistors R1 and R2 in FIG. 5A can be implemented using diffusion resistors, polysilicon resistors or other passive resistor components. FIGS. 7A to 7D illustrate alternative resistor embodiments. As illustrated in FIG. 7A, a resistor can be implemented using an n-channel MOS transistor having a gate connected to a high-voltage bias. As illustrated in FIG. 7B, a resistor can be implemented using a p-channel transistor having a gate connected to VSS. As illustrated in FIG. 7C, a resistor can be implemented using a p-channel transistor in a diode configuration with its gate and drain connected. As illustrated in FIG. 7D, a resistor can be implemented using an n-channel transistor in a diode configuration with its gate and drain connected.

Figure 8A:
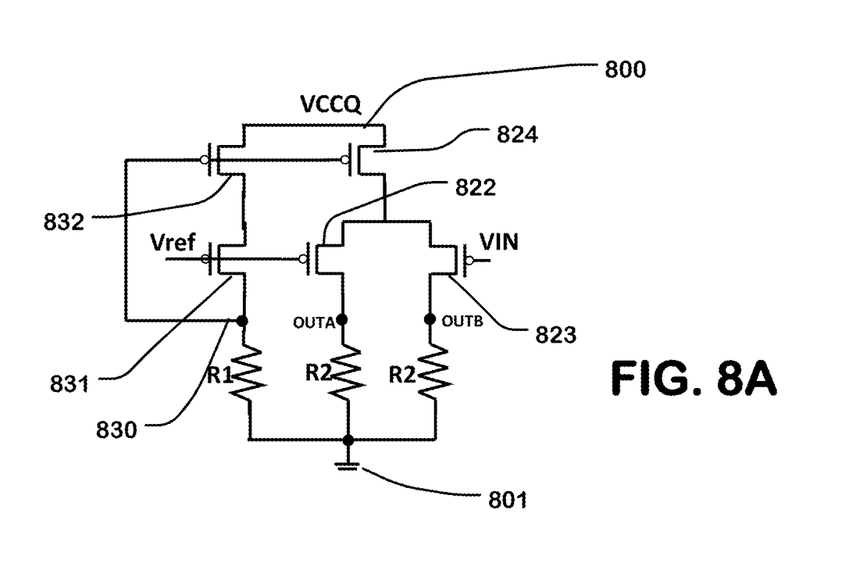
FIGS. 8A and 8B in combination provide a circuit diagram of a two-stage receiver according to the present technology using p-channel MOS transistors for the differential pairs.
Figure 8B:
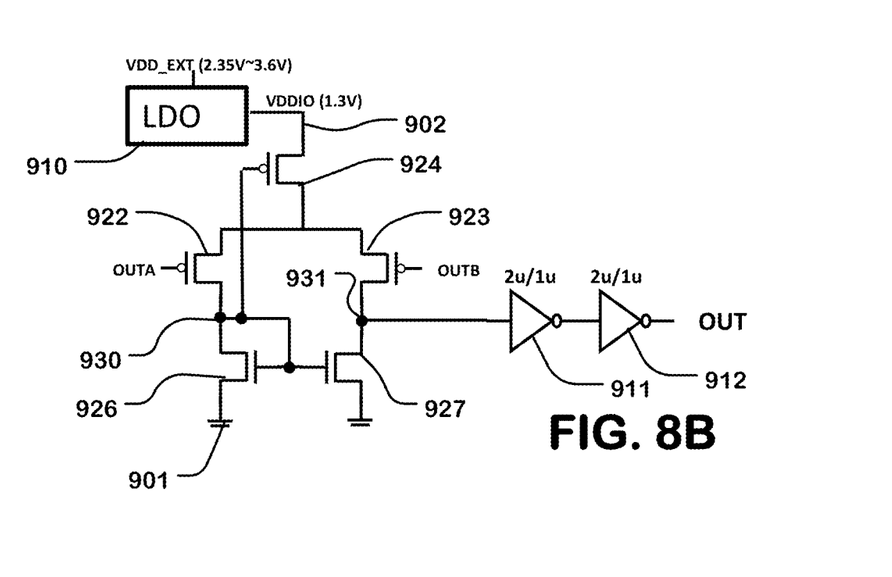

FIGS. 8A and 8B show a two-stage data receiver, for high-speed input signals with low distortion using p-channel differential pairs. The first stage is illustrated in FIG. 8A.

The circuit in FIG. 8A is a preamplifier, and level shifter. The preamplifier includes a differential pair of n-channel MOS transistors 822, 823. Transistor 822 has a drain connected through a resistor having resistance R2 to a drain-side reference voltage (ground in this example) at node 801. Transistor 823 has a drain connected through a resistor having resistance R2 to the drain-side reference voltage at node 801. The sources of transistors 822 and 823 are connected to a drain of p-channel MOS current source transistor 824. A gate of the current source transistor 824 is connected to a bias voltage generated at node 830.

The gate of the transistor 822 is connected to a reference voltage Vref. The gate of transistor 823 is connected to a first stage input node VIN at which a single-ended input signal is received.

The preamplifier also includes a reference current circuit, including a resistor having resistance R1, p-channel transistor 832, and p-channel transistor 831 connected in series between the first drain-side supply voltage (ground in this example) at node 801, and the first source-side supply voltage (VCCQ in this example) at node 800. Transistor 831 has its gate connected to the reference voltage Vref. Also, transistor 832 can have the same width as the transistors 822 and 823. The transistor 832 has its gate connected to node 830, and is arranged in a current mirror fashion with transistor 824. In this example, transistor 832 and transistor 824 have the same transistor widths.

The preamplifier provides a first stage output at the nodes OUTA and OUTB. The output in this example is a differential pair of signals, having common mode voltages which are a function of the ratio of the resistances R1 and R2. Because the resistances on the drains of transistors 822 and 823 are the same value R2, and because the transistors 822 and 823 have the same sizes, common mode voltages of the signals on nodes OUTA and OUTB are about the same. The value R1 controls the voltage at node 830, and therefore controls the magnitude of the current through transistor 832, and via the current mirror relationship controls magnitude of the current through the current source transistor 824. The common mode voltage of the preamplifier stage at nodes OUTA and OUTB is a function of the current through current source transistor 824. Therefore, the common mode voltage of the preamplifier stage can be adjusted by adjusting the ratio of the resistances R1 and R2. In another embodiment, the common mode voltage can be adjusted by adjusting the relative sizes of the transistors 832 and 824. In another embodiment, the common mode voltage can be adjusted by a combination of adjustments of the sizes of the transistors 832 and 824, and resistances R1 and R2. In other circuits, different circuit elements might be used to adjust the common mode voltage.

The preamplifier circuit of FIG. 8A is deployed in a first voltage domain, in this example, having first source-side supply voltage VCCQ, which may be set according to the voltage swing of the first stage input signal on the node VIN.

FIG. 8B is a circuit diagram for a second stage of the high-speed receiver, in which the outputs on node OUTA and OUTB of the first stage shown in FIG. 8A are connected to the second stage inputs of the second stage.

The second stage circuit comprises a second differential pair of p-channel MOS transistors 922, 923, having the drains connected through first and second n-channel MOS current mirror transistors 926, 927 to a drain-side supply voltage (ground in this example) at node 901. The gates of the transistors 922 and 923 connected to respective ones of the differential pair of signals from the nodes OUTA and OUTB in the first stage circuit of FIG. 8A. The sources of the transistors 922 and 923 are connected in common to p-channel MOS current source transistor 924, having a source connected to a second source-side supply voltage at node 902. N-channel current mirror transistors 926 and 927 have their gates connected together at node 930, and also to the drain of the transistor 922, in this example. The circuit sets a self-bias voltage at node 930. In addition, the node 930 is connected to the gate of the current source transistor 924.

In this example, the source-side supply voltage VDDIO at node 902 is about 1.3 V, provided by a voltage regulator 910, such as a low dropout voltage regulator, which sets a voltage difference between source-side node 902 and drain-side node 901. Low dropout voltage regulator 910 receives drain-side supply voltage VDD_EXT, in this example, which may range from about 2.35 V to about 3.6 V.

Thus, the second stage circuit in FIG. 8B is deployed in a different voltage domain than the first stage circuit of FIG. 8A.

Node 931 on the drain of transistor 923 is connected as an input to an inverter 911. The output of inverter 911 is applied to the input of inverter 912, which provides an output voltage OUT representing the voltage applied at the node VIN in the amplifier stage of FIG. 8A. Also, node 931 is connected to the drain of the n-channel transistor 927, of the current mirror including transistors 926 and 927, which contributes to the self-biasing of the second stage circuit.

The inverters 911 and 912 provide buffer to avoid an output loading effect on the node 931. The buffer can be implemented using other types of circuits, such as NOR gates, NAND gates, latches and so on.

A data receiver circuit is illustrated in FIGS. 5A-5B and an alternative illustrated in FIGS. 8A-8B, comprising a first amplifier circuitry configured to receive a reference voltage and a first stage input signal and output control voltages (OUTA, OUTB) based on the reference voltage and the first stage input signal; and a self-bias amplifier circuitry configured to receive the control voltages from the first amplifier circuitry and provide a self-bias voltage for output (node 631, 931) as an output signal to a buffer (610, 611 or 911, 912), wherein the self-bias voltage is connected to a current mirror (transistors 622, 621 or 926, 927) of the self-bias amplifier circuitry.

Figure 9:
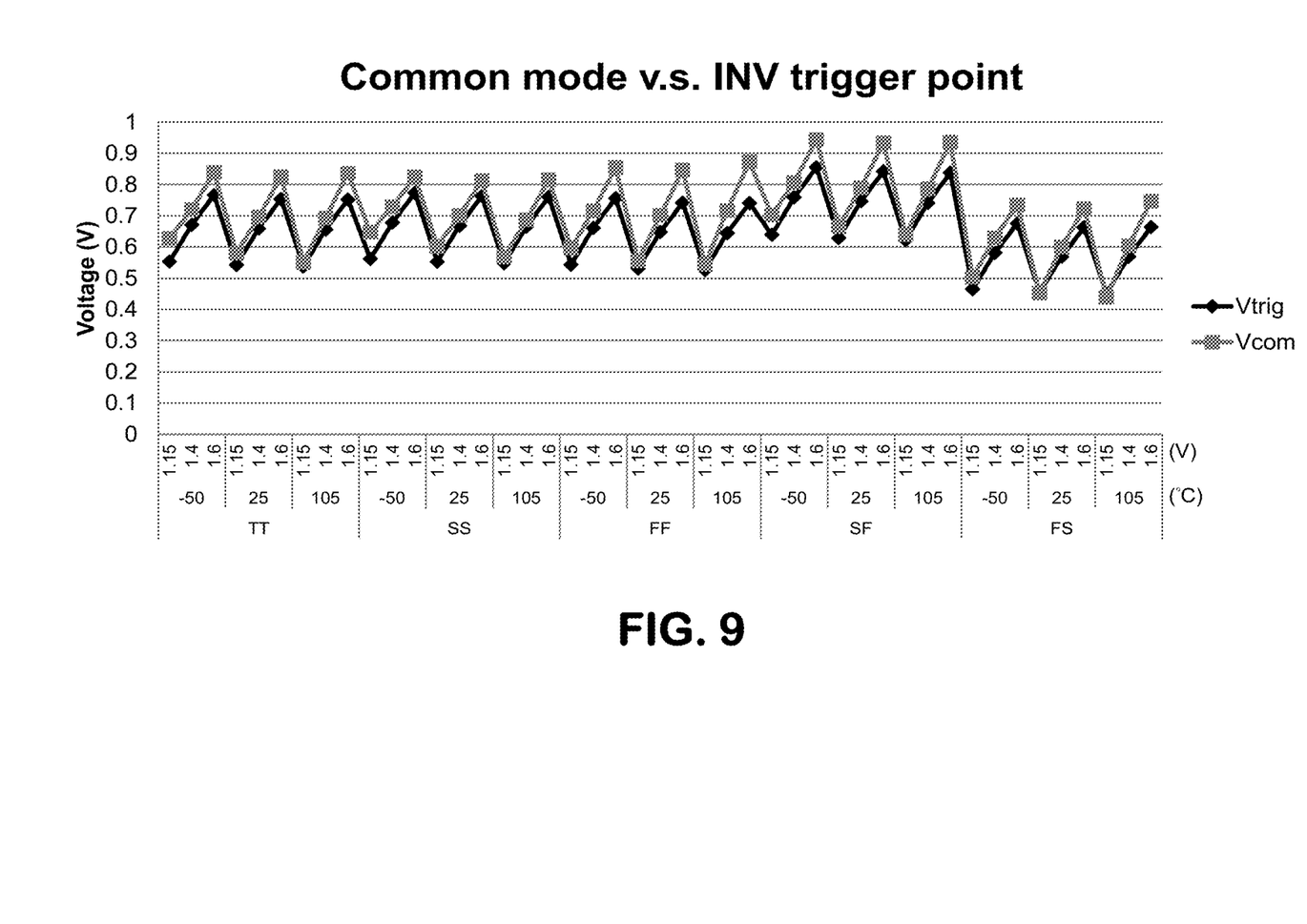
FIG. 9 is a process corner graph comparing common mode voltage of a receiver circuit like that of FIGS. 5A-5B and an inverter trigger point over PVT variations.

FIG. 9 is a process corner graph comparing the common mode voltage VCOM versus the trigger point for the inverter 610 in the circuit of FIGS. 5A-5B over temperature range from about −50° C. to about 105° C., and a supply voltage range of about 1.15 V to about 1.6 V. As seen, the difference is quite small, with a maximum difference of about 0.1 V. This is surprisingly better than the variations of about 0.4 V as seen in FIG. 4.

Figure 10:
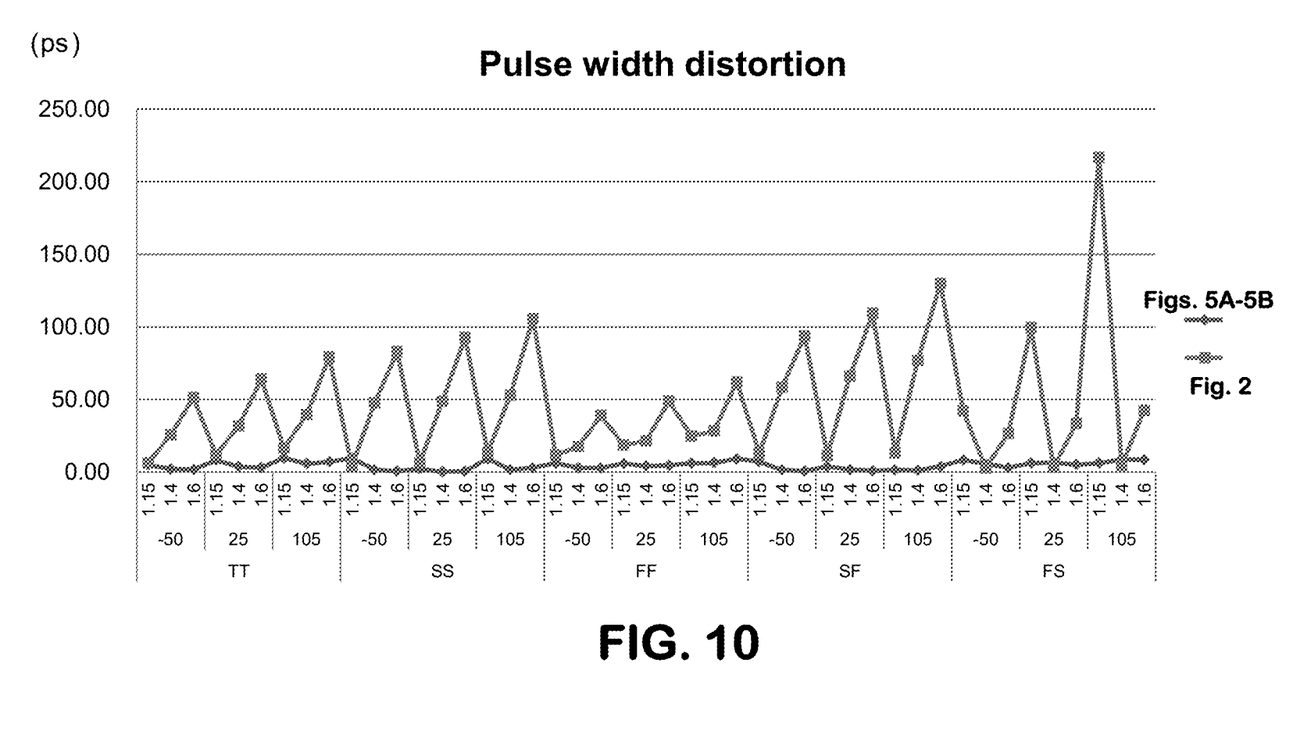
FIG. 10 is a process corner graph comparing pulse width distortion for a circuit like that of FIGS. 5A-5B with pulse width distortion for a circuit like that of FIG. 2 over PVT variations.

FIG. 10 is a process corner graph comparing pulse width distortion for a circuit like that of FIGS. 5A-5B with pulse width distortion for a circuit like that of FIG. 2 over PVT variations. As seen, the pulse width distortion of the circuit of FIGS. 5A-5B is much smaller than the circuit of FIG. 2. The maximum distortion in the circuit of FIGS. 5A-5B in this test was only 9.8 ps, compared to the maximum of about 219 ps for the circuit of FIG. 2.

Figure 11:
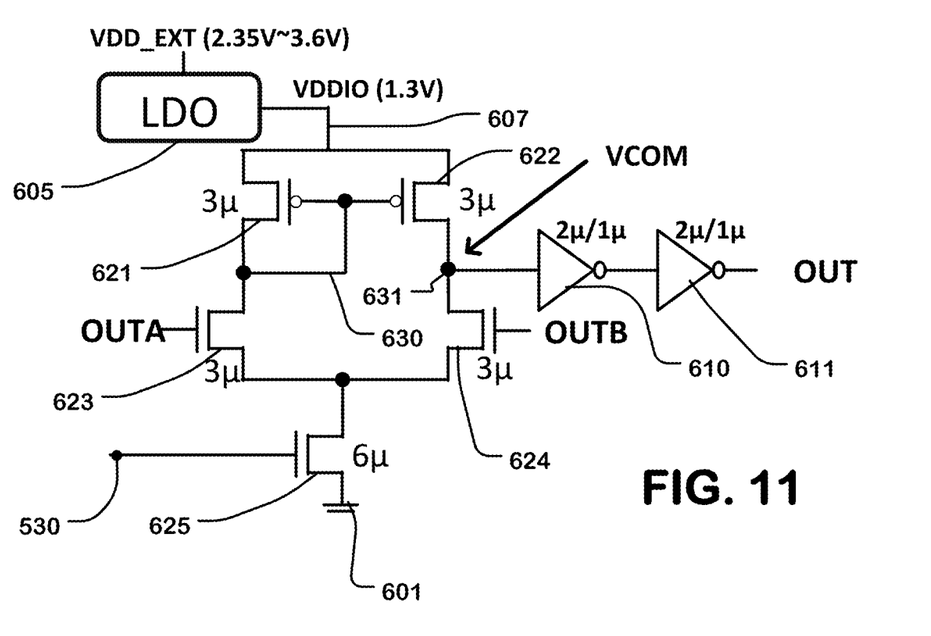
FIG. 11 is a circuit diagram of an alternative second stage circuit which can be used in some embodiments of the receiver described herein.

FIG. 11 is a circuit diagram for an alternative implementation (FIGS. 5A-11) of the second stage for a circuit like that of FIGS. 5A-5B, in which the second stage is not self-biasing. In the diagram of FIG. 11, the same reference numerals as utilized for FIG. 5B are also used and not described again. However, the gate of the current source transistor 625 in the circuit of FIG. 11 is connected to node 530 in the preamplifier stage of FIG. 5A. As a result, the current in the second stage is set as a function of the current in the reference current circuit (including transistor 511) in the first stage circuit.

Figure 12:
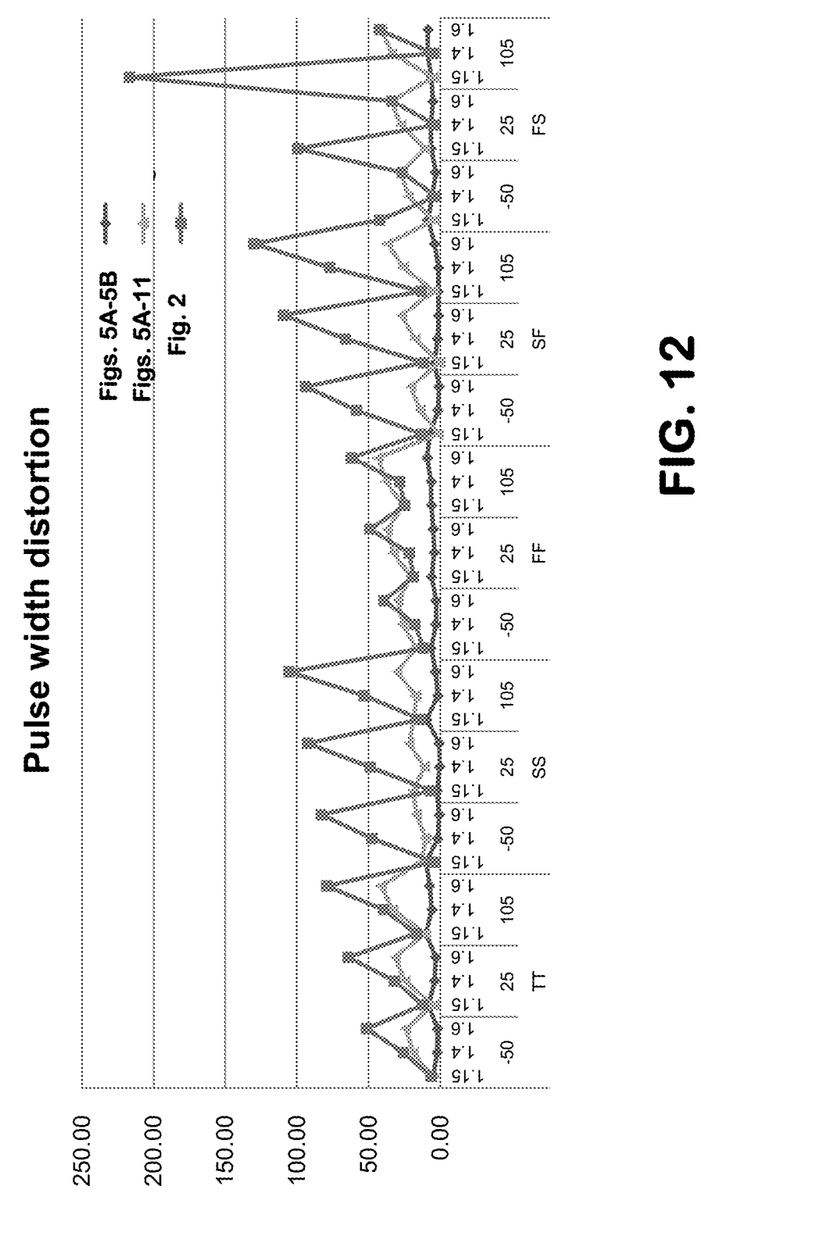
FIG. 12 is a process corner graph comparing pulse width distortion for a circuit like that of FIGS. 5A-11 with that of FIGS. 5A-5B and that of FIG. 2 over PVT variations.

FIG. 12 is a process corner graph comparing pulse width distortion for a circuit like that of FIG. 5A-11, with the circuit of FIGS. 5A-5B and with a circuit like that of FIG. 2 over PVT variations. As seen, the pulse width distortion of the circuit of FIGS. 5A-11 is much smaller than the circuit of FIG. 2, though not as good as that of the circuit of FIG. 2 in this test.

The high-speed data receivers described herein can be used in many types of memory integrated circuits, including DRAM, SRAM, flash memory, RRAM, MRAM, PCRAM, and so on.

A sensitive input receiver with very low input signal distortion is described suitable for high-speed circuits exceeding gigabits per second. A two-stage amplifier is described herein, which can make the amplifier in the receiver output have a common mode voltage tracking the trigger point of an output buffer, such as an inverter. This can reduce the mismatch of rising delay and falling delay to avoid the input signal distortion.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A receiver circuit, comprising:
a first stage circuit having a first stage input and a first stage output, the first stage output setting a first stage common mode voltage;
a second stage circuit having a second stage input connected to the first stage output, and a second stage output setting a second stage common mode voltage; and
a buffer circuit having a trip point voltage, connected to the second stage output;
wherein the first stage circuit includes circuit elements configured to set the first stage common mode voltage so that the second stage common mode voltage matches the trip point voltage.

2. The receiver circuit of claim 1, wherein the circuit receives a single-ended signal on the first stage input, and the first stage output is a differential pair of signals.

3. The receiver circuit of claim 1, wherein the first stage circuit is disposed in a first power domain, and the second stage circuit is disposed in a second power domain, different from the first power domain.

4. The receiver circuit of claim 1, wherein the second stage circuit comprises a self-biased amplifier.

5. The receiver circuit of claim 1, wherein the buffer circuit comprises an inverter having said trip point voltage, connected to the second stage output.

6. The receiver circuit of claim 1, wherein the first stage circuit includes:
a differential pair of transistors, having drains connected through first and second matching resistors to a drain-side supply voltage node, and sources connected to a current source transistor, a first transistor in the differential pair having a gate connected to a reference voltage, and a second transistor in the differential pair having a gate connected to the first stage input; and
a reference current circuit comprising a reference resistor, a first transistor and a second transistor in series between the drain-side supply voltage node and a source-side supply voltage node, the first transistor of the reference current circuit having a gate connected to the reference voltage, the second transistor of the reference current circuit having a gate connected to (i) a node between the reference resistor and the first transistor of the reference current circuit, and (ii) a gate of the current source transistor, wherein:
the elements configured to set the first stage common mode voltage include the reference resistor and the first and second matching resistors.

7. The receiver circuit of claim 6, wherein the second stage circuit comprises a self-biased amplifier.

8. The receiver circuit of claim 6, wherein the first stage output is a differential pair of signals, and the second stage circuit comprises:
a second differential pair of transistors, having drains connected through first and second current mirror transistors to a second drain-side supply voltage node, having gates connected to respective ones of the differential pair of signals of the first stage output, and having sources connected to a second current source transistor.

9. The receiver circuit of claim 8, wherein the second current source transistor has a gate connected to the drain of one of the transistors in the second differential pair of transistors.

10. The receiver circuit of claim 8, including a voltage regulator to set a voltage difference between the second drain-side supply voltage node and a second source-side supply voltage node.

11. The receiver circuit of claim 1, wherein the first stage output is a differential pair of signals, and the second stage circuit comprises:
a differential pair of transistors, having drains connected through first and second current mirror transistors to a drain-side supply voltage, having gates connected to respective ones of the differential pair of signals of the first stage output, and having a source connected to a current source transistor.

12. The receiver circuit of claim 11, wherein the current source transistor has a gate connected to the drain of one of the transistors in the differential pair of transistors.

13. The receiver circuit of claim 11, including a voltage regulator to generate the drain-side supply voltage.

14. A receiver circuit, comprising:
a first differential pair of transistors, having drains connected through first and second matching resistors to a first drain-side supply voltage node, and sources connected to a current source transistor, a first transistor in the first differential pair having a gate connected to a reference voltage, and a second transistor in the first differential pair having a gate connected to a first stage input, drains of the first differential pair of transistors providing a differential pair of signals as a first stage output;

a reference current circuit connected to the first drain-side supply voltage node, and comprising a reference resistor, a first transistor and a second transistor in series, the first transistor of the reference current circuit having a gate connected to the reference voltage, the second transistor of the reference current circuit having a gate connected to (i) a node between the reference resistor and the first transistor of the reference current circuit, and (ii) a gate of the current source transistor connected to the first differential pair of transistors;

a second differential pair of transistors, having drains connected through first and second current mirror transistors to a second drain-side supply voltage node, having gates connected to respective ones of the differential pair of signals, and having sources connected to a second current source transistor; and a buffer circuit connected to the drain of one of the second differential pair of transistors.

15. The receiver circuit of claim 14, wherein the second current source transistor has a gate connected to the drain of a second one of the second differential pair of transistors.

16. The receiver circuit of claim 14, including a voltage regulator to set a voltage difference between the second drain-side supply voltage node and a second source-side supply voltage node.

17. The receiver circuit of claim 14, wherein the first differential pair of transistors is disposed in a first power domain, and the second differential pair of transistors is disposed in a second power domain, different from the first power domain.

18. The receiver circuit of claim 14, wherein the buffer circuit has a trip point voltage, and the second differential pair of transistors has a common mode voltage matching the trip point voltage.

19. The receiver circuit of claim 18, wherein the reference current circuit includes circuit elements configured to establish a first stage common mode voltage of the differential pair of signals so that a signal on the drain of said one of the second differential pair of transistors has the common mode voltage matching the trip point voltage.

20. A data receiver, comprising:
a first amplifier circuit configured to receive a reference voltage and a first stage input signal, and to output control voltages based on the reference voltage and the first stage input signal; and
a self-biased amplifier circuit configured to receive the control voltages from the first amplifier circuit, to set a self-bias voltage and to provide an output signal, wherein the self-bias voltage is connected to a current mirror of the self-biased amplifier circuit.

* * * * *